(12) United States Patent
Sawada et al.

(10) Patent No.: US 10,263,178 B2
(45) Date of Patent: Apr. 16, 2019

(54) MAGNETIC MEMORY DEVICE

(71) Applicant: TOSHIBA MEMORY CORPORATION, Minato-ku, Tokyo (JP)

(72) Inventors: Kazuya Sawada, Seoul (KR); Toshihiko Nagase, Seoul (KR); Youngmin Eeh, Seongnam-si (KR); Daisuke Watanabe, Seoul (KR); Kenichi Yoshino, Seoul (KR); Tadaaki Oikawa, Seoul (KR); Hiroyuki Ohtori, Seoul (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/463,331

(22) Filed: Mar. 20, 2017

(65) Prior Publication Data

US 2018/0076383 A1 Mar. 15, 2018

Related U.S. Application Data

(60) Provisional application No. 62/395,315, filed on Sep. 15, 2016.

(51) Int. Cl.
*H01L 43/08* (2006.01)
*H01L 43/10* (2006.01)
*H01L 27/22* (2006.01)
*H01L 43/12* (2006.01)

(52) U.S. Cl.
CPC ............ *H01L 43/08* (2013.01); *H01L 27/228* (2013.01); *H01L 43/10* (2013.01); *H01L 43/12* (2013.01)

(58) Field of Classification Search
CPC ... H01L 21/76886; H01L 22/14; H01L 27/24; H01L 27/26; H01L 27/3279; H01L 27/329; H01L 45/04; H01L 2924/30101
See application file for complete search history.

(56) References Cited

U.S. PATENT DOCUMENTS

| | | | |
|---|---|---|---|
| 7,663,197 B2 | 2/2010 | Nagase et al. | |
| 9,184,375 B1 | 11/2015 | Tang et al. | |
| 2007/0074317 A1* | 3/2007 | Pakala | B82Y 25/00 257/108 |
| 2011/0193050 A1* | 8/2011 | Takano | H01L 27/2409 257/4 |
| 2012/0199922 A1 | 8/2012 | Uchida et al. | |

(Continued)

*Primary Examiner* — Moin M Rahman
(74) *Attorney, Agent, or Firm* — Holtz, Holtz & Volek PC

(57) ABSTRACT

According to one embodiment, a magnetic memory device includes a first magnetic layer having a variable magnetization direction, a second magnetic layer having a fixed magnetization direction, and a nonmagnetic layer between the first and second magnetic layers. The second magnetic layer includes a first main surface on the nonmagnetic layer side and a second main surface opposite to the first main surface, and includes a first region on the first main surface side and a second region on the second main surface side, and an intermediate region between the first and second regions and containing a predetermined nonmagnetic element. A concentration of the predetermined nonmagnetic element in the intermediate region is higher than that in the first and second regions. The second magnetic layer contains a magnetic element from the first to second main surfaces.

18 Claims, 7 Drawing Sheets

(56) References Cited

U.S. PATENT DOCUMENTS

| | | | | |
|---|---|---|---|---|
| 2013/0299929 A1* | 11/2013 | Watanabe | ............... | H01L 43/02 257/421 |
| 2014/0269037 A1* | 9/2014 | Saida | .................... | G11C 11/161 365/158 |
| 2015/0179926 A1* | 6/2015 | Watanabe | ............. | G11C 11/161 257/421 |

* cited by examiner

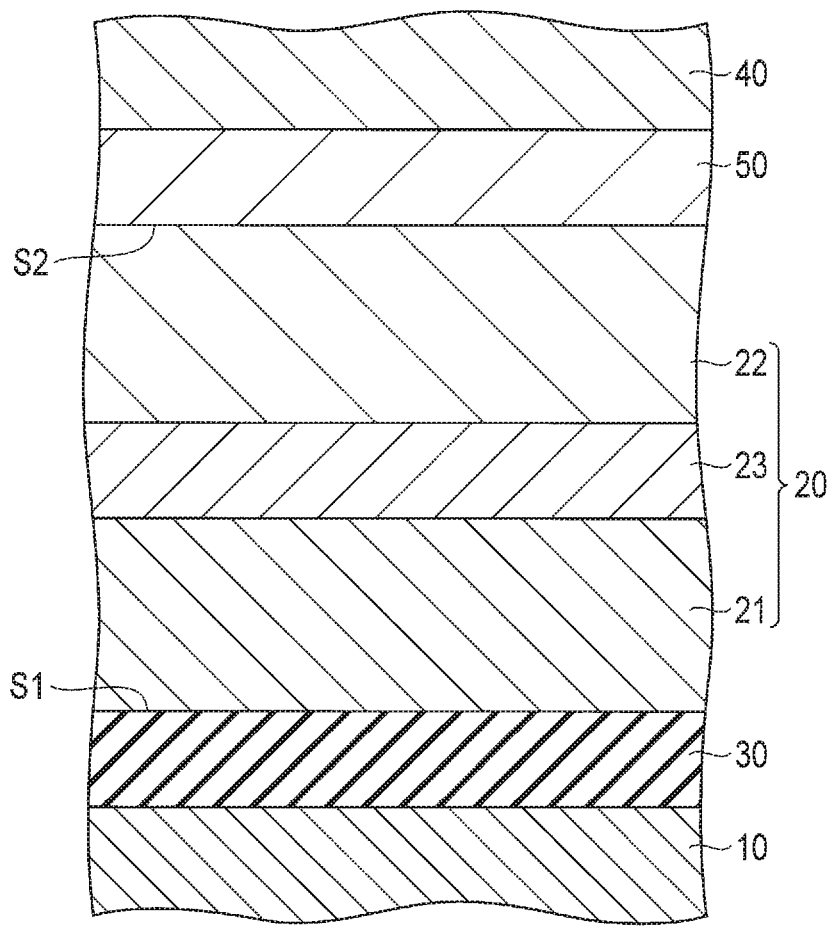
F I G. 2

MAGNETIC MEMORY DEVICE

CROSS-REFERENCE TO RELATED APPLICATIONS

This application claims the benefit of U.S. Provisional Application No. 62/395,315, filed Sep. 15, 2016, the entire contents of which are incorporated herein by reference.

FIELD

Embodiments described herein relate generally to a magnetic memory device.

BACKGROUND

A magnetic memory device (semiconductor integrated circuit device) in which a magnetoresistive element and a MOS transistor are integrated with each other on a semiconductor substrate has been proposed.

The above-described magnetoresistive element generally has a stacked structure which includes a storage layer having a variable magnetization direction, a reference layer having a fixed magnetization direction, and a tunnel barrier layer provided between the storage layer and the reference layer.

The reference layer includes two magnetic layers having the same magnetization direction as each other and one nonmagnetic layer provided between these two magnetic layers. To enhance the magnetic coupling between the two magnetic layers, the nonmagnetic layer should preferably be reduced in thickness. However, if the nonmagnetic layer is reduced in thickness, the characteristics of the reference layer will be degraded. Therefore, there has been demand for a magnetic memory device comprising a magnetoresistive element which can enhance the magnetic coupling between two magnetic layers of a reference layer without degrading the characteristics of the reference layer.

BRIEF DESCRIPTION OF THE DRAWINGS

FIG. 2 is a schematic sectional diagram mainly showing the structure of a reference layer of the magnetic memory device of the embodiment.

DETAILED DESCRIPTION

In general, according to one embodiment, a magnetic memory device includes a stacked structure including a first magnetic layer having a variable magnetization direction; a second magnetic layer having a fixed magnetization direction; and a nonmagnetic layer provided between the first magnetic layer and the second magnetic layer, wherein the second magnetic layer includes a first main surface on the nonmagnetic layer side and a second main surface opposite to the first main surface, the second magnetic layer includes a first region located on the first main surface side, a second region located on the second main surface side, and an intermediate region located between the first region and the second region and containing a predetermined nonmagnetic element, a concentration of the predetermined nonmagnetic element in the intermediate region is higher than that in the first region and that in the second region, and the second magnetic layer contains a magnetic element from the first main surface to the second main surface.

Embodiments will be described hereinafter with reference to the accompanying drawings.

Figure 1:
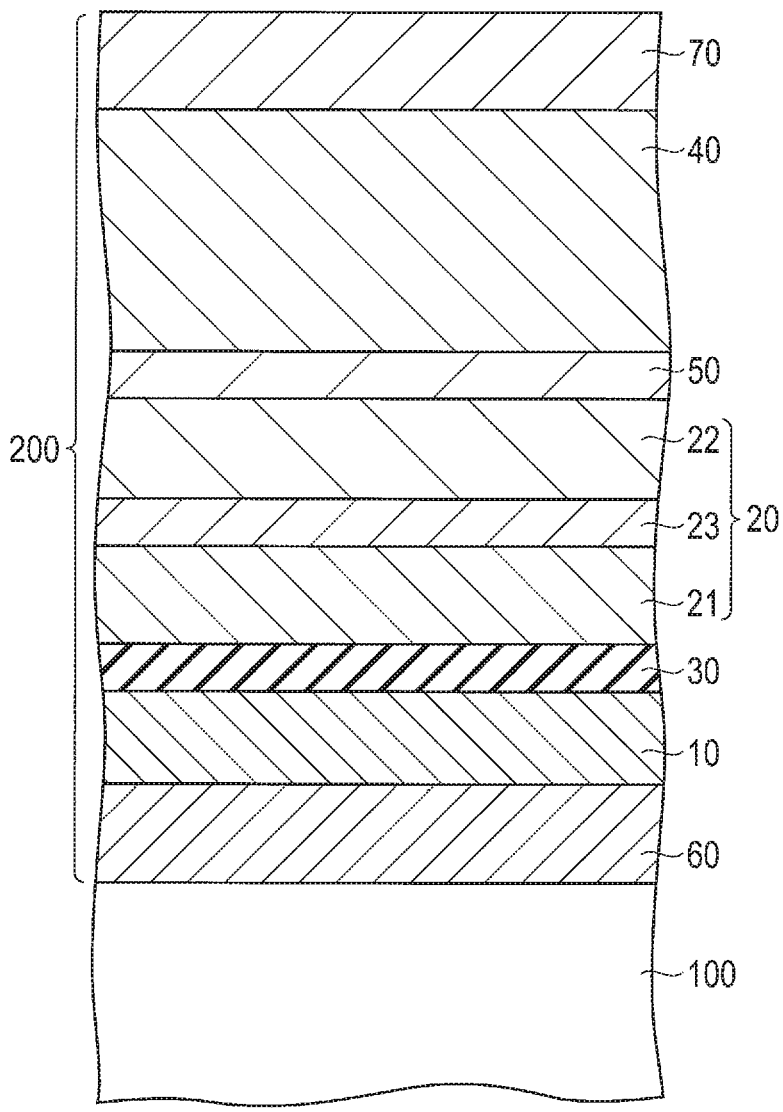
FIG. 1 is a schematic sectional diagram mainly showing the structure of a magnetoresistive element of a magnetic memory device (semiconductor integrated circuit device) of an embodiment.

FIG. 1 is a schematic sectional diagram mainly showing the structure of a magnetoresistive element of a magnetic memory device (semiconductor integrated circuit device) of an embodiment.

The magnetoresistive element is provided on an underlying region 100 and comprises a stacked structure 200. The magnetoresistive element of the present embodiment is a spin transfer torque (STT) magnetoresistive element having perpendicular magnetization. Note that the magnetoresistive element is referred to also as a magnetic tunnel junction (MTJ) element.

The underlying region 100 includes a semiconductor substrate, a MOS transistor, an interconnect, an interlayer insulating film, and the like.

The stacked structure 200 includes, in order from the bottom, an underlayer 60, a storage layer (a first magnetic layer) 10, a tunnel barrier layer (a nonmagnetic layer) 30, a reference layer (a second magnetic layer) 20, a spacer 50, a shift cancelling layer (a third magnetic layer) 40, and a cap layer 70.

The storage layer (the first magnetic layer) 10 has a variable magnetization direction which is perpendicular to the main surface thereof. The storage layer 10 is formed of a ferromagnetic material containing iron (Fe) and boron (B). The storage layer 10 may further contain cobalt (Co) in addition to iron (Fe) and boron (B). In the present embodiment, the storage layer 10 is CoFeB.

The reference layer (the second magnetic layer) 20 has a fixed magnetization direction which is perpendicular to the main surface thereof. The reference layer 20 includes a first region 21, a second region 22, and an intermediate region 23 located between the first region 21 and the second region 22. The reference layer 20 will be described later in details.

The tunnel barrier layer (the nonmagnetic layer) 30 is provided between the storage layer 10 and the reference layer 20. The tunnel barrier layer 30 is formed of an insulating material containing magnesium (Mg) and oxygen (O). In the present embodiment, the tunnel barrier layer 30 is MgO.

The shift cancelling layer (the third magnetic layer) 40 has a fixed magnetization direction which is perpendicular to the main surface thereof. The magnetization direction of the shift canceling layer 40 is antiparallel to the magnetization direction of the reference layer 20. It is possible to reduce a magnetic field applied from the reference layer 20 to the storage layer 10 by providing the shift cancelling layer 40. The shift canceling layer 40 contains cobalt (Co) and an element selected from platinum (Pt), nickel (Ni), and palladium (Pd). In the present embodiment, the shift cancelling layer 40 is formed of a Co/Pt superlattice.

The spacer layer 50 is provided between the reference layer 20 and the shift cancelling layer 40. The spacer layer 50 is, for example, ruthenium (Ru).

The underlayer 60 is provided between the underlying region 100 and the storage layer 10, and the cap layer 70 is provided on the shift canceling layer 40. The underlayer 60 is connected to a bottom electrode (not shown), and the cap layer 70 is connected to a top electrode (not shown).

In the above-described stacked structure 200 of the magnetoresistive element, the resistance produced when the magnetization direction of the storage layer 10 is parallel to the magnetization direction of the reference layer 20 is lower than the resistance produced when the magnetization direction of the storage layer 10 is antiparallel to the magnetization direction of the reference layer 20. That is, the stacked structure 200 is in a low-resistance state when the magnetization direction of the storage layer 10 is parallel to the magnetization direction of the reference layer 20, while the stacked structure 200 is in a high-resistance state when the magnetization direction of the storage layer 10 is antiparallel to the magnetization direction of the reference layer 20. In this way, according to the resistance state (the low-resistance state and the high-resistance state), the magnetoresistive element can store binary data 0 or 1. Further, it is possible to set the resistance state (the low-resistance state and the high-resistance state) according to the direction of a write current which flows through the magnetoresistive element (the stacked structure 200).

Next, the reference layer (second magnetic layer) 20 will be described. FIG. 2 is a schematic sectional diagram mainly showing the reference layer 20.

The reference layer 20 has a first main surface S1 on the tunnel barrier layer 30 side, and a second main surface S2 on the side opposite to the first main surface S1 side, and includes the first region 21 located on the first main surface S1 side, the second region 22 located on the second main surface S2 side, and the intermediate region 23 located between the first region 21 and the second region 22. Both the first region 21 and the second region 22 are magnetic regions and have the same magnetization direction as each other. That is, the magnetization direction of the first region 21 and the magnetization direction of the second region 22 are parallel to each other.

The reference layer 20 contains a magnetic element in the entire reference layer 20 from the first main surface S1 to the second main surface S2. The intermediate region 23 contains a predetermined nonmagnetic element which is not contained or not contained as a main element in either of the first region 21 and second region 22. More specifically, the intermediate region 23 contains the predetermined nonmagnetic element in the entire region. It is preferable that only the intermediate region 23 should contain the predetermined nonmagnetic element and the first region 21 and the second region 22 should not contain the predetermined nonmagnetic element. However, in practice, as the predetermined nonmagnetic element is diffused or the like, the predetermined nonmagnetic element moves from the intermediate region 23 to the first region 21 or the second region 22, and thus the first region 21 and the second region 22 may contain the predetermined nonmagnetic element as well. For this reason, the nonmagnetic element which is originally contained in the intermediate region 23 is defined as an element which is not contained as "a main element" in either of the first region 21 and the second region 22. Note that the intermediate region 23 may include a magnetic region or may include a nonmagnetic region.

For example, the first region 21 of the reference layer 20 is a ferromagnetic region containing iron (Fe) and boron (B). The first region 21 may further contain cobalt (Co) in addition to iron (Fe) and boron (B). In the present embodiment, the first region 21 is CoFeB.

The second region 22 of the reference layer 20 is a ferromagnetic region containing cobalt (Co) and an element selected from platinum (Pt), nickel (Ni), and palladium (Pd). In the present embodiment, the second region 22 is formed of a Co/Pt superlattice.

The predetermined nonmagnetic element contained in the intermediate region 23 of the reference layer 20 is selected from tantalum (Ta), titanium (Ti), vanadium (V), chromium (Cr), zirconium (Zr), niobium (Nb), molybdenum (Mo), hafnium (Hf), and tungsten (W). In the present embodiment, the intermediate region 23 contains tantalum (Ta) as the predetermined nonmagnetic element.

The magnetic element contained in the intermediate region 23 of the reference layer 20 is selected from iron (Fe), cobalt (Co), and nickel (Ni). In the present embodiment, the intermediate region 23 contains the same magnetic element as that of the first region 21. That is, in the present embodiment, the intermediate region 23 contains iron (Fe) and cobalt (Co). The ratio (composition ratio) of the magnetic element in the intermediate region 23 should preferably be 10% or more.

Next, the first example distribution of the magnetic element and the predetermined nonmagnetic element contained in the reference layer 20 will be described with reference to FIGS. 3 and 4.

Figure 3:
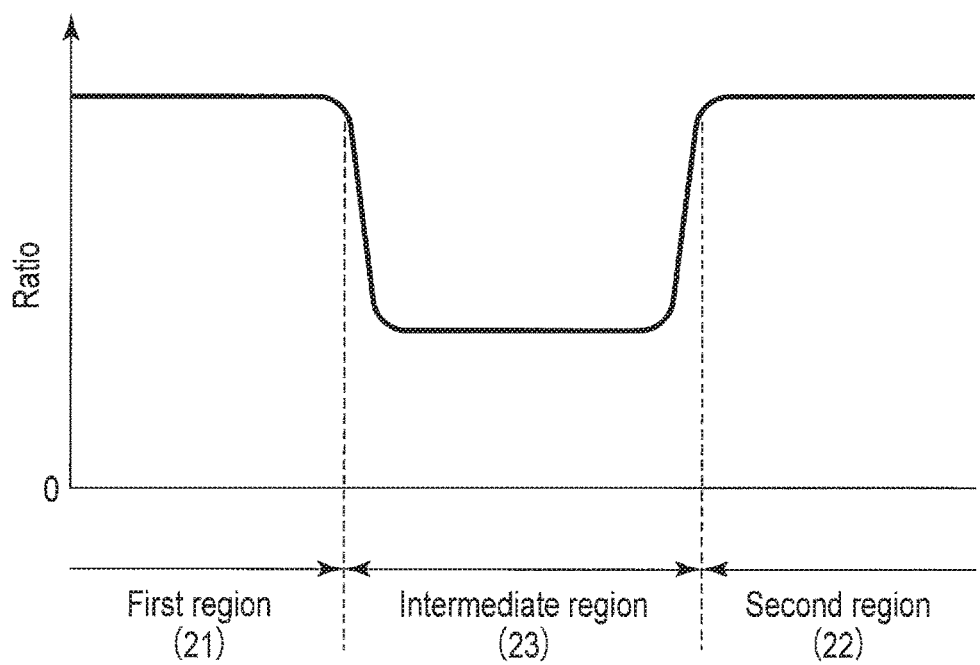
FIG. 3 is a schematic diagram showing first example distribution of magnetic elements contained in the reference layer.

FIG. 3 is a schematic diagram showing the ratio of magnetic elements contained in the reference layer 20 in the first example distribution. As shown in FIG. 3, the reference layer 20 contains the magnetic elements entirely across the first region 21, the second region 22, and the intermediate region 23. That is, the first region 21 of the reference layer 20 is a magnetic region and contains a magnetic element in the entire region. The second region 22 of the reference layer 20 is also a magnetic region and contains a magnetic element in the entire region. Further, in the present embodiment, the intermediate region 23 contains a magnetic element in the entire region as well. In the first example distribution, the concentration (ratio) of the magnetic element contained in the intermediate region 23 is substantially uniform except for a region near the boundary between the intermediate region 23 and the first region 21 and a region near the boundary between the intermediate region 23 and the second region 22. The intermediate region 23 may be a magnetic region or may be a nonmagnetic region.

Figure 4:
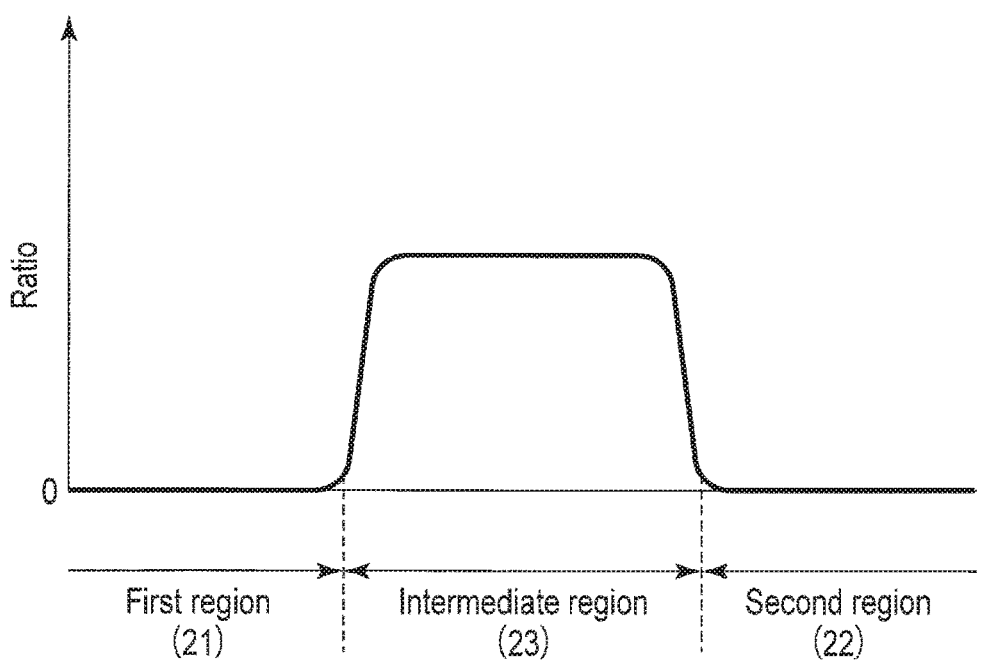
FIG. 4 is a schematic diagram showing first example distribution of a predetermined nonmagnetic element contained in the reference layer.

FIG. 4 is a schematic diagram showing the ratio of the predetermined nonmagnetic element contained in the reference layer 20 in the first example distribution. In the first example distribution, the concentration (ratio) of the predetermined nonmagnetic element contained in the intermediate region 23 is substantially uniform except for a region near the boundary between the intermediate region 23 and the first region 21 and a region near the boundary between the intermediate region 23 and the second region 22.

The structure which exhibits the above-described first example distribution can be formed as follows. First, to form the first region 21, a first sputtering process is performed, and a magnetic layer A (for example, a CoFeB layer) is formed. Next, to form the intermediate region 23, namely, a second sputtering process is performed. More specifically, a sputtering process using a target of the magnetic element (for example, Co and Fe) and a sputtering process using a target of the predetermined nonmagnetic element (for example, Ta) are simultaneously performed in the same chamber. Alternatively, a sputtering process using a target containing both the magnetic element (for example, Co and Fe) and the predetermined nonmagnetic element (for example, Ta) may be performed. In this way, a mixture layer containing a mixture of the magnetic element (for example, Co and Fe) and the predetermined nonmagnetic element (for example, Ta) is formed. Next, to form the second region 22, a third sputtering process is performed, and a magnetic layer B (for example, a Co/Pt layer) is formed. Then, through patterning and thermal processing, and the like, the reference layer 20 which exhibits such distribution as that shown in FIGS. 3 and 4 can be obtained.

Note that, between the magnetic layer A formed in the first sputtering process and the mixture layer formed in the second sputtering process, the element contained in the magnetic layer A and the element contained in the mixture layer are mutually diffused into each other in the thermal processing. Similarly, between the mixture layer formed in the second sputtering process and the magnetic layer B formed in the third sputtering process, the element contained in the mixture layer and the element contained in the magnetic layer B are mutually diffused into each other in the thermal processing. Therefore, the boundary between the first region 21 and the intermediate region 23 and the boundary between the second region 22 and the intermediate region 23 are not clearly defined.

Next, the second example distribution of the magnetic element and the predetermined nonmagnetic element contained in the reference layer 20 will be described with reference to FIGS. 5 and 6.

Figure 5:
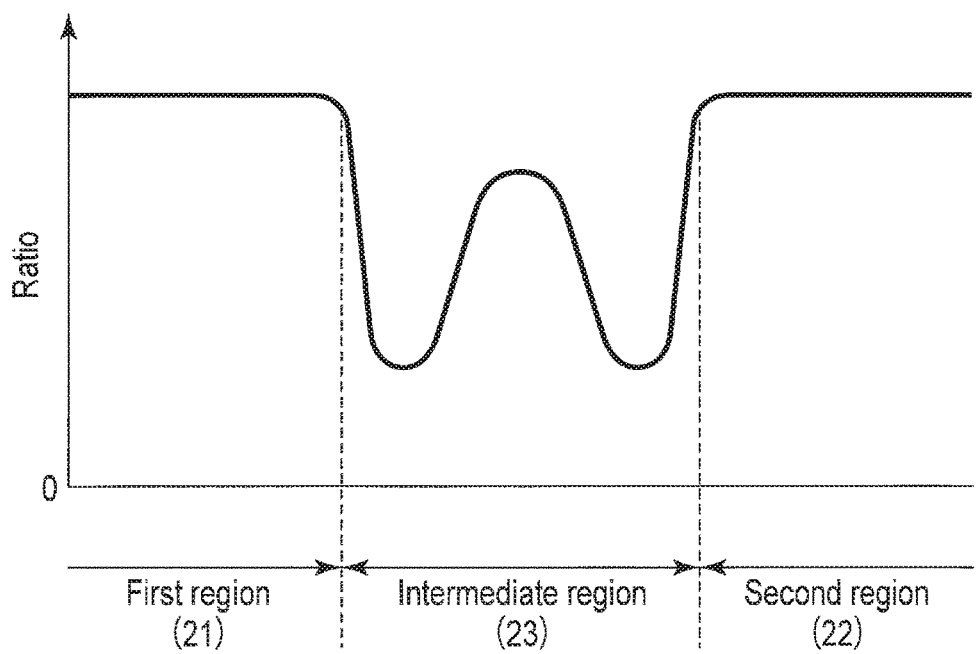
FIG. 5 is a schematic diagram showing second example distribution of magnetic elements contained in the reference layer.

FIG. 5 is a schematic diagram showing the ratio of magnetic elements contained in the reference layer 20 in the second example distribution. Also in the second example distribution, the reference layer 20 contains the magnetic elements entirely across the first region 21, the second region 22, and the intermediate region 23. That is, the first region 21 of the reference layer 20 is a magnetic region and contains a magnetic element in the entire region. The second region 22 of the reference layer 20 is also a magnetic region and contains a magnetic element in the entire region. Further, also in the present distribution example, the intermediate region 23 contains a magnetic element in the entire region as well. In the second example distribution, the concentration (ratio) of the magnetic element contained in the intermediate region 23 has a local maximum value and a local minimum value within the intermediate region 23. Note that the intermediate region 23 may be a magnetic region or a nonmagnetic region, or may include both a magnetic region and a nonmagnetic region.

Figure 6:
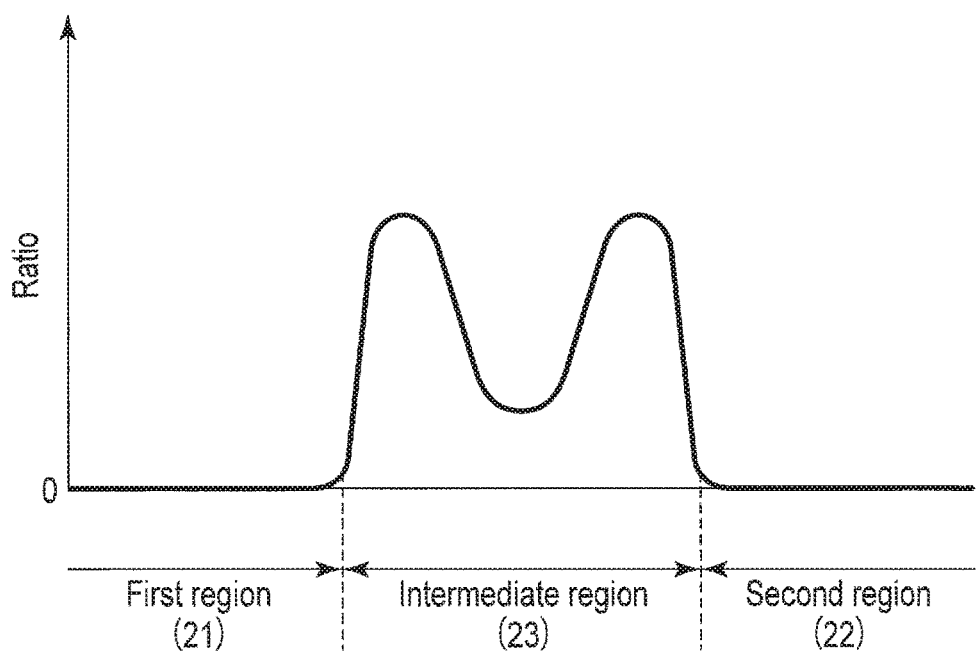
FIG. 6 is a schematic diagram showing second example distribution of a predetermined nonmagnetic element contained in the reference layer.

FIG. 6 is a schematic diagram showing the ratio of the predetermined nonmagnetic element contained in the reference layer 20 in the second example distribution. In the second example distribution, the concentration (ratio) of the predetermined nonmagnetic element contained in the intermediate region 23 has a local maximum value and a local minimum value within the intermediate region 23. More specifically, the concentration (ratio) of the predetermined nonmagnetic element has the local minimum value and the local maximum value in the positions corresponding to positions where the concentration (ratio) of the magnetic element contained in the intermediate region 23 has the local maximum value and the local minimum value.

The structure which exhibits the above-described second example distribution can be formed as follows. First, to form the first region 21, a first sputtering process is performed, and a magnetic layer A (for example, a CoFeB layer) is formed. Next, to form the intermediate region 23, a second sputtering process is performed. More specifically, a first sub-sputtering process using a target of the predetermined nonmagnetic element (for example, Ta) is performed. Then, a second sub-sputtering process using a target of the magnetic element (for example, Co and Fe) is performed. After that, a third sub-sputtering process using a target of the predetermined nonmagnetic element (for example, Ta) is performed. Subsequently, to form the second region 22, a third sputtering process is performed, and a magnetic layer B (for example, a Co/Pt layer) is formed. Finally, through patterning and thermal processing, and the like, the reference layer 20 which exhibits such distribution as that shown in FIGS. 5 and 6 can be obtained. That is, according to each layer formed in each sub-sputtering process of the second sputtering process, the local maximum value of the concentration (ratio) of the predetermined nonmagnetic element and the local maximum value of the concentration (ratio) of the magnetic element are obtained. Further, in the thermal processing, the elements in the layers formed in the respective sub-sputtering processes of the second sputtering process are mutually diffused into each other, and thus the magnetic element (for example, Co and Fe) and the predetermined nonmagnetic element (for example, Ta) are contained in the entire intermediate region 23. Note that, for the same reason as that of the first example distribution, usually, the boundary between the first region 21 and the intermediate region 23 and the boundary between the second region 22 and the intermediate region 23 are not clearly defined. Further, in the second sputtering process, after the third sub-sputtering process is performed, the second sub-sputtering process and the third sub-sputtering process may be repeated one or more times.

As described above, in the magnetoresistive element of the present embodiment, the magnetic element is contained in the entire reference layer 20. That is, the magnetic element is also contained in the entire intermediate region 23 of the reference layer 20. According to the present embodiment having the above-described structure, it is possible to enhance the magnetic coupling, more specifically, the ferromagnetic coupling between the first region 21 and the second region 22 of the reference layer 20 without reducing the thickness of the intermediate region 23. Therefore, according to the present embodiment, a magnetic memory device comprising a magnetoresistive element having excellent characteristics can be obtained. In the following, the above-described technical effect of the present embodiment will be described in details.

It is reported as an example that a reference layer is composed of two magnetic layers (a magnetic layer X and a magnetic layer Y) having the same magnetization direction as each other and one nonmagnetic layer provided between these two magnetic layers. To enhance the magnetic coupling of the two magnetic layers, the nonmagnetic layer should preferably be reduced in thickness. However, if the nonmagnetic layer is reduced in thickness, the characteristics of the reference layer will be degraded as will be described below. For example, if the nonmagnetic layer is reduced in thickness, its technical effects such as an effect of absorbing boron (B) from the magnetic layer X and an effect of preventing an element such as cobalt (Co) contained in the magnetic layer Y from being diffused into the magnetic layer X will be diminished, accordingly. As a result, a problem such as a decrease in the MR value of the magnetoresistive element arises.

In the present embodiment, the predetermined nonmagnetic element as well as the magnetic element are contained in the entire intermediate region 23 between the first region 21 (corresponding to the magnetic layer X) and the second region 22 (corresponding to the magnetic layer Y) of the reference layer 20. Since the magnetic element is contained in the entire intermediate region 23, even if the intermediate region 23 has a large thickness, the magnetic coupling between the first region 21 and the second region 22 can be enhanced. Therefore, in the present embodiment, it is possible to improve the magnetic coupling between the first region 21 and the second region 22 without degrading the characteristics of the magnetoresistive element. As a result, according to the present embodiment, a magnetic memory device comprising a magnetoresistive element having excellent characteristics can be obtained.

Figure 7:
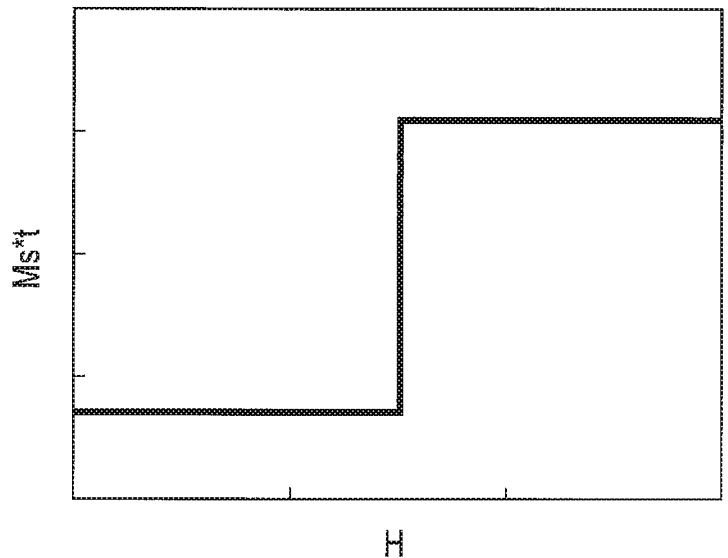
FIG. 7 is a schematic diagram showing M-H characteristics of the magnetoresistive element of the embodiment.
Figure 8:
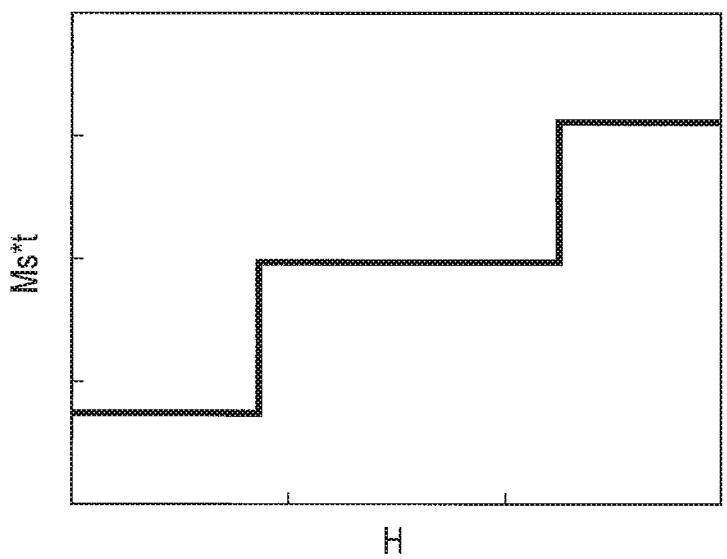
FIG. 8 is a schematic diagram showing M-H characteristics of a magnetoresistive element of a comparative example of the embodiment.

FIG. 7 is a schematic diagram showing the M-H characteristics of the magnetoresistive element of the present embodiment (in a case where the reference layer 20 exhibits the second example distribution shown in FIGS. 5 and 6), and FIG. 8 is a schematic diagram showing the M-H characteristics of a magnetoresistive element of a comparative example. In the drawings, the horizontal axis indicates an external magnetic field, while the vertical axis indicates a magnetization value.

Figure 9A:
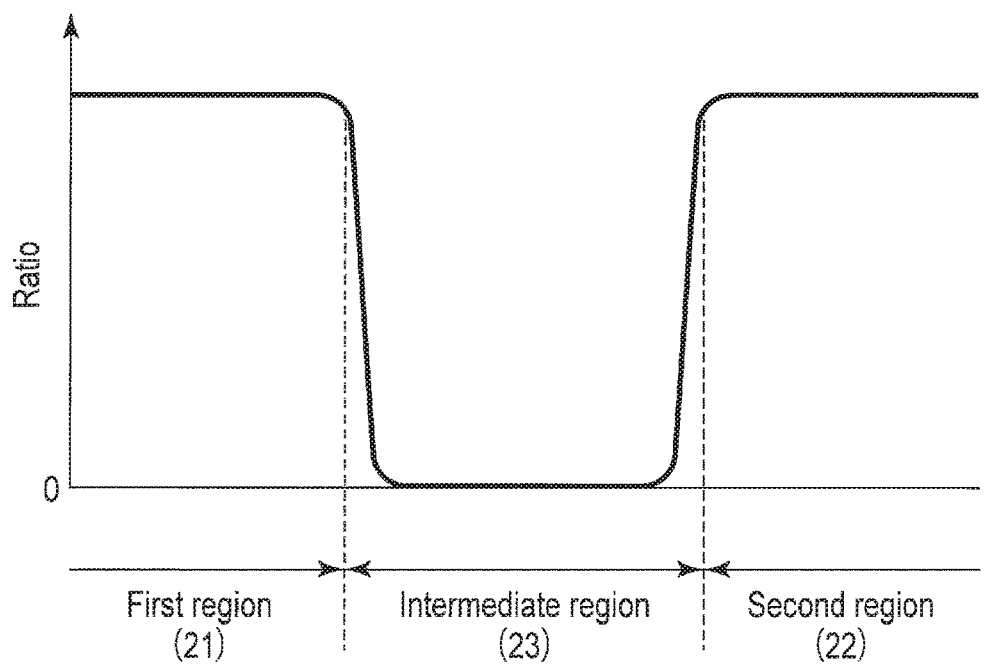
FIG. 9A is a schematic diagram showing example distribution of magnetic elements contained in a reference layer of the magnetoresistive element of the comparative example of the embodiment.
Figure 9B:
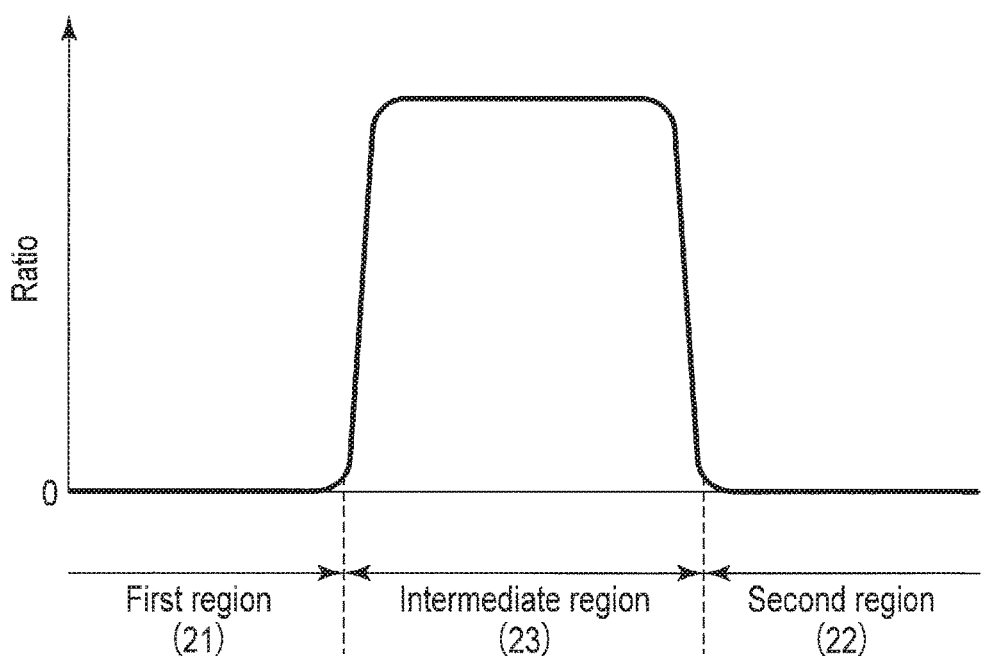
FIG. 9B is a schematic diagram showing example distribution of a predetermined nonmagnetic element contained in the reference layer of the magnetoresistive element of the comparative example of the embodiment.

FIG. 9A is a schematic diagram showing the ratio of magnetic elements contained in a reference layer 20 of the magnetoresistive element of the comparative example. FIG. 9B is a schematic diagram showing the ratio of a predetermined nonmagnetic element contained in the reference layer 20 of the magnetoresistive element of the comparative example. As shown in FIGS. 9A and 9B, an intermediate region 23 of the reference layer 20 substantially does not contain any magnetic element.

Although the magnetization of the two magnetic layers are separately inverted in the comparative example shown in FIG. 8, the magnetization of the two magnetic layers are simultaneously inverted in the present embodiment shown in FIG. 7. Therefore, in the present embodiment, the magnetic coupling between the two magnetic layers (corresponding to the first region 21 and the second region 22) are enhanced.

Figure 10:
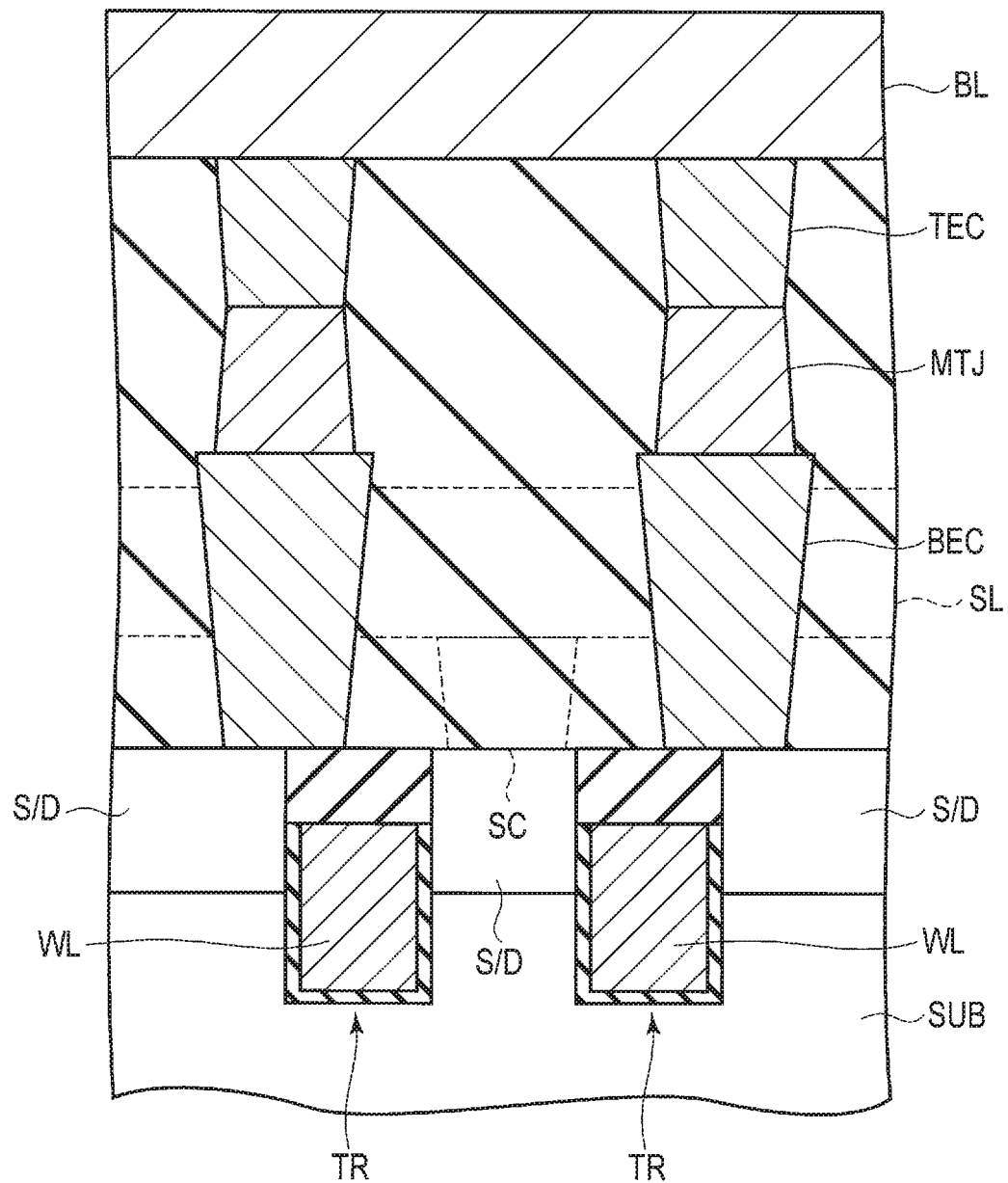
FIG. 10 is a schematic diagram showing the general structure of the semiconductor integrated circuit device comprising the magnetoresistive element of the embodiment.

FIG. 10 is a schematic diagram showing the general structure of the semiconductor integrated circuit device comprising the magnetoresistive element (MTJ element) of the present embodiment.

In a semiconductor substrate SUB, a buried-gate MOS transistor TR is formed. The gate electrode of the MOS transistor TR is used as a word line WL. In the MOS transistor TR, one of the source/drain regions S/D is connected to a bottom electrode BEC, and the other of the source/drain regions S/D is connected to a source-line contact SC.

A magnetoresistive element MTJ is formed on the bottom electrode BEC. A top electrode TEC is formed on the magnetoresitive element MTJ. The top electrode TEC is connected to a bit line BL. The source-line contact SC is connected to a source line SL.

As the magnetoresistive element of the present embodiment is applied to such a semiconductor integrated circuit device as that shown in FIG. 10, an excellent semiconductor integrated circuit device (magnetic memory device) can be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory device comprising a stacked structure including a first magnetic layer having a variable magnetization direction; a second magnetic layer having a fixed magnetization direction; and a nonmagnetic layer provided between the first magnetic layer and the second magnetic layer, wherein:

the second magnetic layer includes a first main surface on the nonmagnetic layer side and a second main surface opposite to the first main surface, the second magnetic layer includes a first region located on the first main surface side, a second region located on the second main surface side, and an intermediate region located between the first region and the second region and containing a predetermined nonmagnetic element, a concentration of the predetermined nonmagnetic element in the intermediate region being higher than that in the first region and that in the second region, and a magnetic element is contained within at least a portion of each of the first region, the second region and the intermediate region of the second magnetic layer from the first main surface to the second main surface thereof, and wherein the intermediate region has a concentration distribution of the predetermined nonmagnetic element in a stacked direction of the stacked structure, and a concentration of the predetermined nonmagnetic element increases to a first point of the concentration distribution and decreases from the first point and increases to a second point of the concentration distribution and decreases from the second point.

2. The magnetic memory device of claim 1, wherein a concentration of a magnetic element contained in the intermediate region is substantially uniform except for a region near a boundary between the intermediate region and the first region and a region near a boundary between the intermediate region and the second region.

3. The magnetic memory device of claim 1, wherein the intermediate region has a concentration distribution of a magnetic element in a stacked direction of the stacked structure, and a concentration of the magnetic element decreases to a first point of the concentration distribution and increases from the first point and decreases to a second point of the concentration distribution and increases from the second point.

4. The magnetic memory device of claim 1, wherein the intermediate region contains a same magnetic element as a magnetic element contained in the first region.

5. The magnetic memory device of claim 1, wherein the predetermined nonmagnetic element contained in the intermediate region is selected from tantalum (Ta), titanium (Ti), vanadium (V), chromium (Cr), zirconium (Zr), niobium (Nb), molybdenum (Mo), hafnium (Hf), and tungsten (W).

6. The magnetic memory device of claim 1, wherein a magnetic element contained in the intermediate region is selected from iron (Fe), cobalt (Co), and nickel (Ni).

7. The magnetic memory device of claim 1, wherein the first region contains iron (Fe) and boron (B).

8. The magnetic memory device of claim 7, wherein the first region further contains cobalt (Co).

9. The magnetic memory device of claim 1, wherein the second region contains cobalt (Co) and an element selected from platinum (Pt), nickel (Ni), and palladium (Pd).

10. The magnetic memory device of claim 1, wherein the intermediate region includes a magnetic region.

11. The magnetic memory device of claim 1, wherein the intermediate region includes a nonmagnetic region.

12. The magnetic memory device of claim 1, wherein the first region and the second region have the same magnetization direction as each other.

13. The magnetic memory device of claim 1, wherein the first magnetic layer contains iron (Fe) and boron (B).

14. The magnetic memory device of claim 13, wherein the first magnetic layer further contains cobalt (Co).

15. The magnetic memory device of claim 1, wherein the nonmagnetic layer contains magnesium (Mg) and oxygen (O).

16. The magnetic memory device of claim 1, wherein the stacked structure further includes a third magnetic layer having a fixed magnetization direction which is antiparallel to the magnetization direction of the second magnetic layer.

17. The magnetic memory device of claim 16, wherein the third magnetic layer contains cobalt (Co) and an element selected from platinum (Pt), nickel (Ni), and palladium (Pd).

18. The magnetic memory device of claim 1, wherein a resistance of the stacked structure produced when the magnetization direction of the first magnetic layer is parallel to the magnetization direction of the second magnetic layer is lower than a resistance of the stacked structure produced when the magnetization direction of the first magnetic layer is antiparallel to the magnetization direction of the second magnetic layer.

* * * * *